(12) United States Patent
Suga et al.

(10) Patent No.: US 10,693,070 B2
(45) Date of Patent: Jun. 23, 2020

(54) MANUFACTURING METHOD FOR ELECTROLUMINESCENCE DEVICE

(71) Applicant: Sharp Kabushiki Kaisha, Sakai, Osaka (JP)

(72) Inventors: Katsuyuki Suga, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/463,012

(22) PCT Filed: Aug. 8, 2017

(86) PCT No.: PCT/JP2017/028751
§ 371 (c)(1),
(2) Date: May 22, 2019

(87) PCT Pub. No.: WO2019/030819
PCT Pub. Date: Feb. 14, 2019

(65) Prior Publication Data
US 2019/0326513 A1 Oct. 24, 2019

(51) Int. Cl.
*H01L 51/56* (2006.01)
*B32B 43/00* (2006.01)
(Continued)

(52) U.S. Cl.
CPC .......... *H01L 51/003* (2013.01); *B32B 43/006* (2013.01); *H01L 27/3244* (2013.01);
(Continued)

(58) Field of Classification Search
CPC .......... Y10T 156/1158; Y10T 156/1917; Y10T 156/1184; Y10T 156/1967; B32B 43/006; H01L 2227/326
See application file for complete search history.

(56) References Cited

U.S. PATENT DOCUMENTS 8,198,113 B2 * 6/2012 Nihei ............ H01L 33/32
257/E21.475
8,986,497 B2 * 3/2015 Sercel ............ B32B 38/0008
156/712
(Continued)

FOREIGN PATENT DOCUMENTS

JP 2003-115380 A 4/2003
JP 2010-033761 A 2/2010
(Continued)

OTHER PUBLICATIONS

Official Communication issued in International Patent Application No. PCT/JP2017/028751, dated Oct. 31, 2017.

*Primary Examiner* — Mark A Osele
(74) *Attorney, Agent, or Firm* — Keating & Bennett, LLP

(57) ABSTRACT

Provided is a method for manufacturing an EL device, the method including peeling a mother substrate from a layered body including a light-emitting element layer with irradiation with a laser. The mother substrate and the layered body are in contact with each other with a resin layer of the layered body interposed therebetween, and in a case that the peeling is performed by irradiating the resin layer with the laser, the irradiation is performed on at least a part of an end portion of the resin layer under a condition different from that in a central portion of the resin layer.

20 Claims, 8 Drawing Sheets

(51) Int. Cl.
  *H01L 51/00*   (2006.01)
  *H01L 27/32*   (2006.01)

(52) U.S. Cl.
  CPC .......... *H01L 51/0097* (2013.01); *H01L 51/56* (2013.01); *B32B 2457/206* (2013.01); *H01L 2227/326* (2013.01); *H01L 2251/5338* (2013.01); *Y10T 156/1158* (2015.01); *Y10T 156/1184* (2015.01); *Y10T 156/1917* (2015.01); *Y10T 156/1967* (2015.01)

(56) References Cited

U.S. PATENT DOCUMENTS

| | | | | |
|---|---|---|---|---|
| 9,111,983 | B1* | 8/2015 | Ginter | H01L 21/6835 |
| 9,875,918 | B2* | 1/2018 | Jung | B32B 38/10 |
| 10,153,392 | B2* | 12/2018 | Musashi | H01L 33/0079 |
| 10,159,120 | B2* | 12/2018 | Ishida | H01L 51/5203 |
| 2009/0095418 | A1* | 4/2009 | Yamamoto | H01L 21/67132 |
| | | | | 156/712 |
| 2013/0014905 | A1* | 1/2013 | Nakazawa | B32B 43/006 |
| | | | | 156/712 |
| 2013/0078752 | A1 | 3/2013 | Sakano et al. | |
| 2014/0127480 | A1 | 5/2014 | Masuda | |
| 2014/0318697 | A1* | 10/2014 | Tan | H01L 21/673 |
| | | | | 156/247 |
| 2015/0236280 | A1 | 8/2015 | Sakuishi et al. | |
| 2016/0133864 | A1 | 5/2016 | Kim et al. | |
| 2017/0194605 | A1 | 7/2017 | Kuji | |
| 2017/0305134 | A1* | 10/2017 | Hirakata | B32B 27/08 |
| 2018/0108874 | A1 | 4/2018 | Tanaka et al. | |
| 2019/0067605 | A1 | 2/2019 | Tanaka et al. | |
| 2020/0106032 | A1* | 4/2020 | Nagata | H01L 27/3276 |

FOREIGN PATENT DOCUMENTS

| | | |
|---|---|---|
| JP | 2013-073001 A | 4/2013 |
| JP | 2015-064468 A | 4/2015 |
| JP | 2015-173104 A | 10/2015 |
| JP | 2016-095504 A | 5/2016 |
| JP | 2017-123216 A | 7/2017 |
| WO | 2012/164612 A1 | 12/2012 |
| WO | 2016/143316 A1 | 9/2016 |
| WO | 2017/154235 A1 | 9/2017 |

* cited by examiner

FIG. 8A
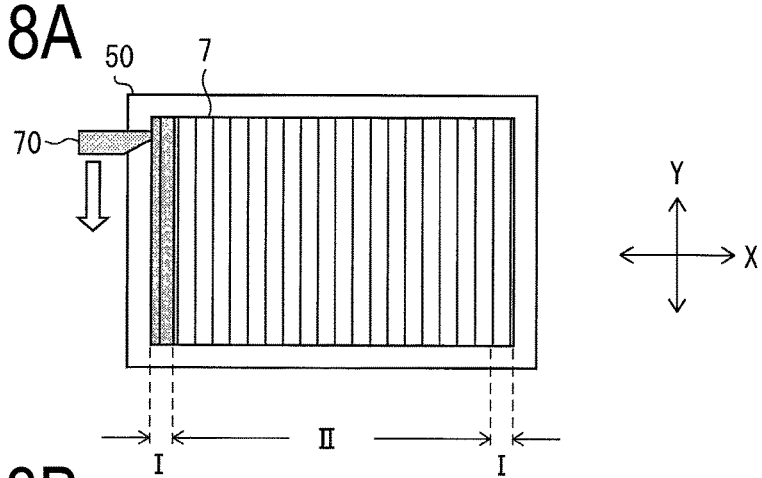
FIG. 8B
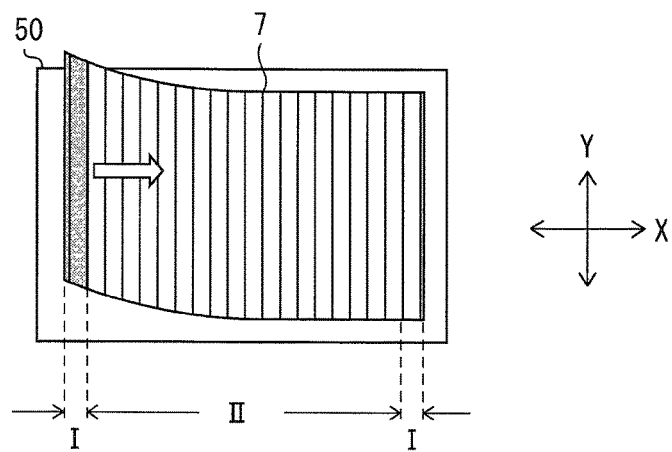
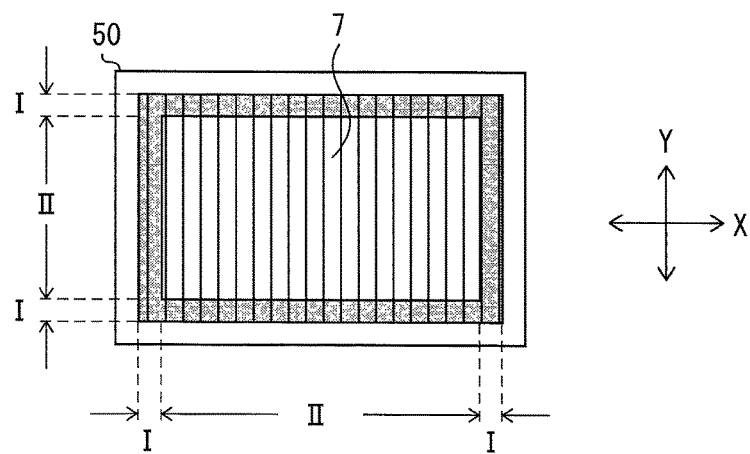
FIG. 9

MANUFACTURING METHOD FOR ELECTROLUMINESCENCE DEVICE

TECHNICAL FIELD

The disclosure relates to an electroluminescence element (EL) device including an EL element.

BACKGROUND ART

When a flexible EL device including an EL element is manufactured, a mother substrate need to be peeled from a resin layer formed on the mother substrate.

CITATION LIST

Patent Literature

PTL 1: JP 2013-73001 A (Publication date: Apr. 22, 2013)
PTL 2: JP 2010-33761 A (Publication date: Feb. 12, 2010)
PTL 3: WO2012/164612 (International Publication date: Dec. 6, 2012)

SUMMARY

Technical Problem

An object of the disclosure is to suppress deterioration in yield and an increase in manufacturing cost when a mother substrate is peeled from a resin layer formed on the mother substrate.

Solution to Problem

A method for manufacturing an EL device according to an aspect of the disclosure includes a process of peeling a mother substrate from a layered body including a light-emitting element layer with irradiation with a laser. The mother substrate and the layered body are in contact with each other with a resin layer of the layered body interposed between the mother substrate and the layered body, and in a case that the process of peeling is performed by irradiating the resin layer with the laser, an irradiation of the laser is performed on at least a part of an end portion of the resin layer under a condition different from a condition in a central portion of the resin layer.

Advantageous Effects of Disclosure

According to an aspect of the disclosure, deterioration in yield and an increase in manufacturing cost are minimized when a mother substrate is peeled from a resin layer formed on the mother substrate.

BRIEF DESCRIPTION OF DRAWINGS

FIG. 3A illustrates a state before step 7, FIG. 3B illustrates a state in step 7, and FIG. 3C illustrates a state in step 8.

FIG. 4A illustrates a state after step 7, and FIG. 4B illustrates a state in step 8.

FIG. 5A illustrates a state after step 7, and FIG. 4B illustrates a state in step 8.

FIG. 6A illustrates an outline of the first laser irradiation in step 7, FIG. 6B illustrates an outline of the second laser irradiation in step 7, and FIG. 6C illustrates an outline of step 8.

FIG. 7A illustrates an outline of the first laser irradiation in step 7, and FIG. 7B illustrates an outline of the second laser irradiation in step 7.

FIGS. 8A and 8B are drawings each illustrating an outline of step 8 of another embodiment. FIG. 8A illustrates an outline of insertion of a knife, and FIG. 8B illustrates an outline of peeling of a layered body.

FIG. 9 is a drawing illustrating an outline of step 7 of another embodiment.

DESCRIPTION OF EMBODIMENTS

Figure 1:
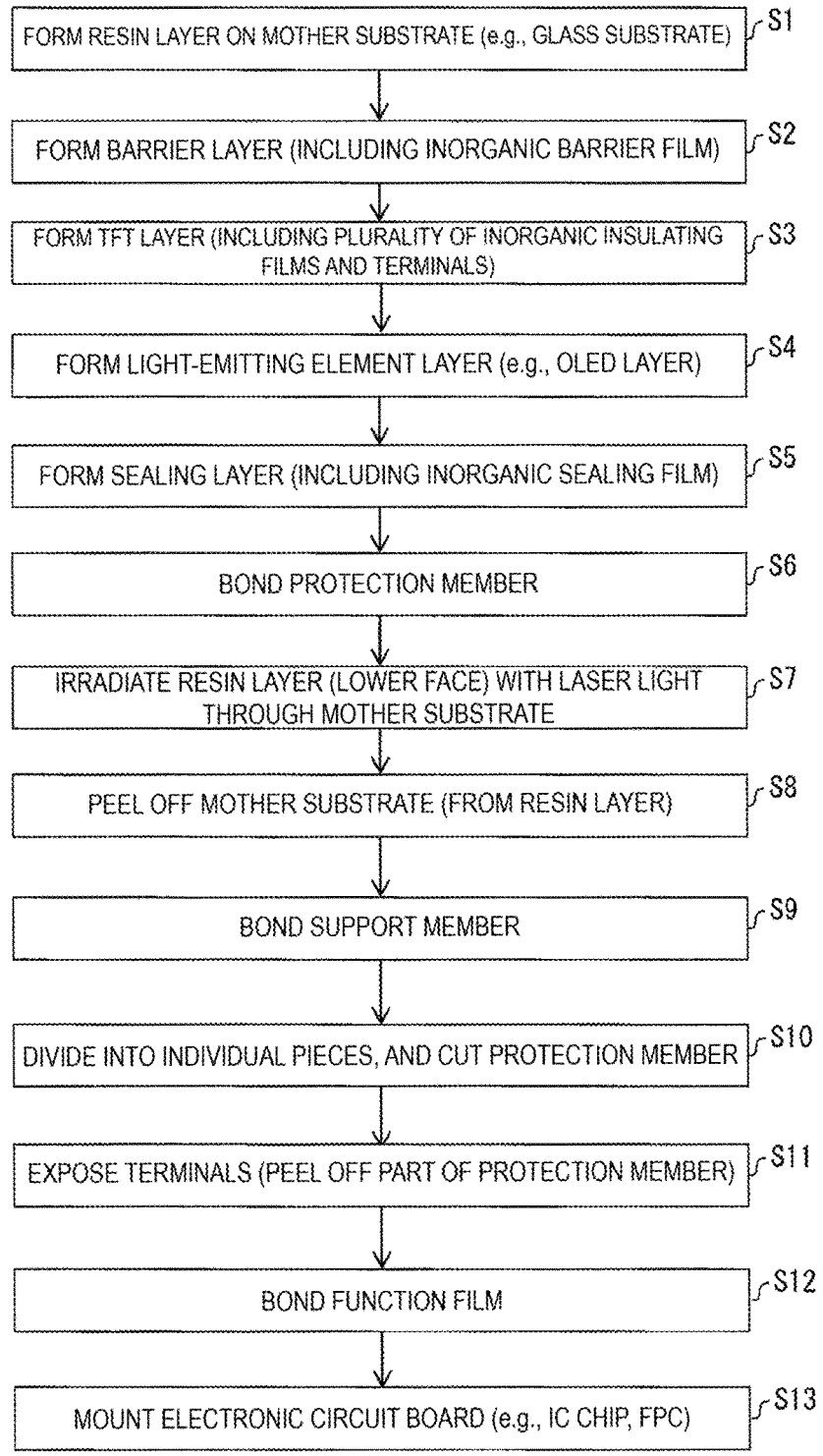
FIG. 1 is a flowchart illustrating an example of a manufacturing method for an EL device.
Figure 2A:
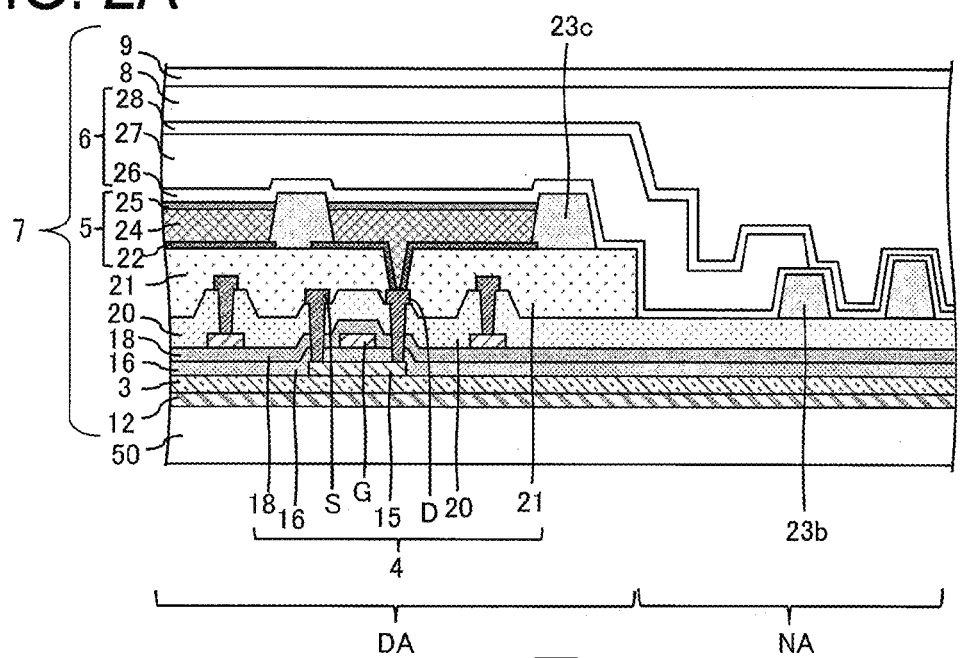
FIG. 2A is a cross-sectional view illustrating a configuration example during a step of manufacturing an EL device of the present embodiment.
Figure 2B:
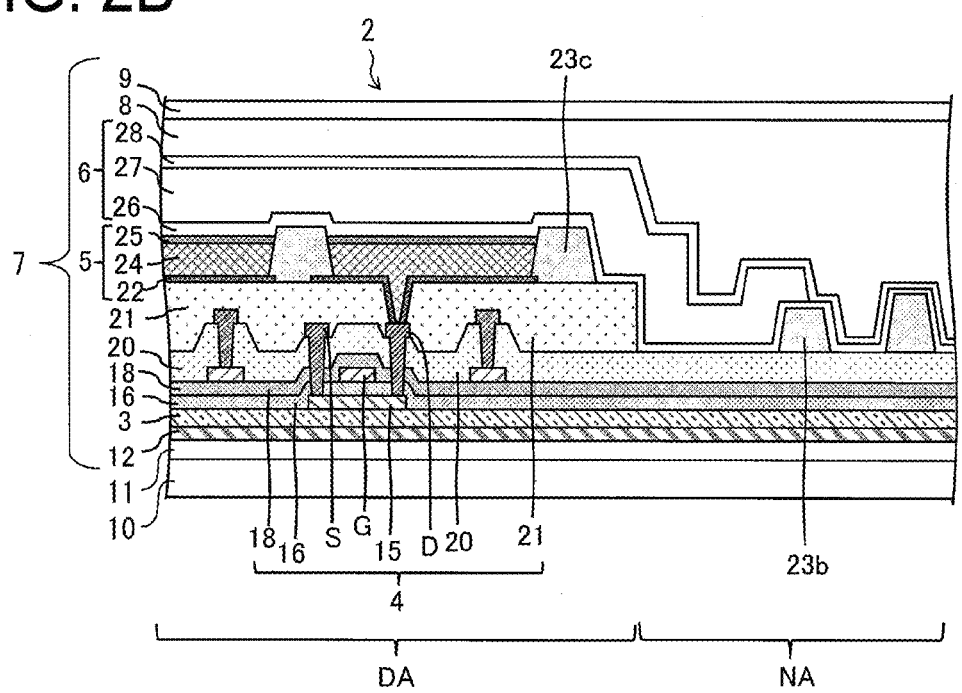
FIG. 2B is a cross-sectional view illustrating a configuration example of an EL device of the present embodiment.

FIG. 1 is a flowchart illustrating an example of the manufacturing method for an EL device. FIG. 2A is a cross-sectional view illustrating a configuration example during a step of manufacturing an EL device of the present embodiment. FIG. 2B is a cross-sectional view illustrating a configuration example of the EL device of the present embodiment.

When a flexible EL device is manufactured, a resin layer 12 is first formed on a transparent mother substrate (e.g., a glass substrate) 50 (step S1), as illustrated in FIGS. 1 and 2A. Next, an inorganic barrier film 3 is formed (step S2). Subsequently, a TFT layer 4 is formed, the TFT layer 4 including a plurality of inorganic insulating films 16, 18, and 20, and a flattening film 21 (step S3). Next, a light-emitting element layer (e.g., an OLED element layer) 5 is formed (step S4). Subsequently, a sealing layer 6 is formed, the sealing layer 6 including a first inorganic sealing film 26 and a second inorganic sealing film 28, and an organic sealing film 27 (step S5). Next, a protection member 9 (a PET film, for example) is bonded to the sealing layer 6, with an adhesive layer 8 interposed therebetween (step S6).

Subsequently, the resin layer 12 is irradiated with a laser (step S7). Here, the resin layer 12 absorbs the emitted laser to cause a lower face of the resin layer 12 (an interface with the mother substrate 50) to change in properties due to ablation. This forms a peeling layer 13 (refer to FIG. 3B described below), and a bonding force between the resin layer 12 and the mother substrate 50 deteriorate. Next, the mother substrate 50 is peeled from the resin layer 12 (step S8). This causes the mother substrate 50 to be peeled from a layered body 7 illustrated in FIG. 2A. The layered body 7 represents the entire multi-layered body formed on the mother substrate 50 and represents a layer from the resin layer 12 formed on the mother substrate 50 to the protection member 9 being an outermost layer in an example illustrated in FIG. 2A.

A manufacturing method for an EL device according to an aspect of the disclosure particularly has features in steps S7 and S8. Details thereof will be described below.

Next, as illustrated in FIG. 2B, a support member 10 (e.g., a PET film) is bonded to the lower face of the resin layer 12 with an adhesive layer 11 interposed therebetween (step S9). Subsequently, the mother substrate 50 is divided while the protection member 9 is cut, so that a plurality of EL devices are cut (step S10). Next, the protection member 9 on a terminal portion of the TFT layer 4 is peeled off, and terminal exposure is performed (step S11). As a result, an EL device 2 illustrated in FIG. 2B is obtained. Then, a function film 39 is bonded (step S12), and an electronic circuit board is mounted on the terminal portion using an ACF or the like (step S13). Each of the steps above is performed by a manufacturing apparatus of an EL device.

Examples of the material of the resin layer 12 include polymide, epoxy, and polyamide. Among them, polyimide is suitably used.

The inorganic barrier film 3 is configured to prevent water or impurities from reaching the TFT layer 4 or the light-emitting element layer 5, and may be made of a silicon oxide film, a silicon nitride film, or a silicon oxynitride film, formed with CVD, or a layered film thereof, for example. The inorganic barrier layer 3 has a thickness from 50 nm to 1500 nm, for example.

The TFT layer 4 includes a semiconductor film 15, the inorganic insulating film 16 (gate insulating film) formed on an upper side of the semiconductor film 15, a gate electrode G formed on an upper side of the gate insulating film 16, the inorganic insulating films 18 and 20 formed on an upper side of the gate electrode G, a source electrode S, a drain electrode D, and a terminal TM, formed on an upper side of the inorganic insulating film 20, and the flattening film 21 formed on an upper side of each of the source electrode S and the drain electrode D. The semiconductor film 15, the inorganic insulating film 16, the gate electrode G, the inorganic insulating films 18 and 20, the source electrode S, and the drain electrode D constitute a thin film transistor (TFT). A terminal portion is formed in the end portion (non-active region NA) of the TFT layer 4, and the terminal portion includes a plurality of terminals TM used for connection with an IC chip and an electronic circuit board such as a FPC, and a terminal wiring line TW. Each of the terminals TM is electrically connected to the corresponding one of various wiring lines of the TFT layer 4 with the terminal wiring line TW therebetween.

The semiconductor film 15 is made of a low-temperature polysilicon (LTPS) or an oxide semiconductor, for example. The gate insulating film 16 can be formed of, for example, a silicon oxide (SiOx) film, a silicon nitride (SiNx) film, or a layered film thereof formed using a CVD method. The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), or copper (Cu). Note that, in FIGS. 2A and 2B, the TFT is illustrated that has a top gate structure in which the semiconductor film 15 functions as the channel, but the TFT may have a bottom gate structure (when the channel of the TFT is formed in the oxide semiconductor, for example).

The inorganic insulating films 18 and 20 can be constituted by a silicon oxide (SiOx) film or a silicon nitride (SiNx) film, or a layered film of these, formed using CVD. The flattening film 21 is an organic insulating film that can be made of a coatable photosensitive organic material such as polymide, or acrylic, for example.

The light-emitting element layer 5 (e.g., an organic light emitting diode layer) includes an anode electrode 22 formed on an upper side of the flattening film 21, a partition 23c that defines a subpixel of an active region DA, a bank 23b formed in the non-active region NA, an electroluminescence (EL) layer 24 formed on the anode electrode 22, and a cathode electrode 25 formed on an upper side of the EL layer 24, and the anode electrode 22, the EL layer 24, and the cathode electrode 25 constitute a light-emitting element (e.g., an organic light emitting diode).

The partition 23c and the bank 23b may be formed in the same step, for example, using a coatable photosensitive organic material such as polyimide, epoxy, or acrylic. The bank 23b of the non-active region NA is formed on the inorganic insulating film 20. The bank 23b defines the edge of the organic sealing film 27.

The EL layer 24 is formed by vapor deposition or an ink-jet method in a region (subpixel region) enclosed by the partition 23c. In a case that the light-emitting element layer 5 is an organic light emitting diode (OLED) layer, for example, the EL layer 24 is formed by layering a hole injecting layer, a hole transport layer, a light emitting layer, an electron transport layer, and an electron injecting layer from the lower layer side.

The anode electrode (anode) 22 is composed of a layer made of an alloy containing Indium Tin Oxide (ITO) and Ag and has light reflectivity. The cathode electrode 25 may be made of a transparent metal such as Indium Tin Oxide (ITO) or Indium Zinc Oxide (IZO).

In a case that the light-emitting element layer 5 is the OLED layer, positive holes and electrons are recombined inside the EL layer 24 by a drive current between the anode electrode 22 and the cathode electrode 25, and light is emitted as a result of excitons that are generated by the recombination falling into a ground state.

The light-emitting element layer 5 is not limited to OLED element configurations and may be an inorganic light emitting diode or a quantum dot light emitting diode.

The sealing layer 6 includes a first inorganic sealing film 26 covering the partition 23c and the cathode electrode 25, an organic sealing film 27 covering the first inorganic sealing film 26, and a second inorganic sealing film 28 covering the organic sealing film 27.

The first inorganic sealing film 26 and the second inorganic sealing film 28 can be each constituted by a silicon oxide film, a silicon nitride film, or a silicon oxynitride film, or by a layered film of these, formed using CVD. The organic sealing film 27 is a transparent organic insulating film that is thicker than the first inorganic sealing film 26 and the second inorganic sealing film 28, and may be formed of a coatable photosensitive organic material such as polymide or acrylic. For example, after coating the first inorganic sealing film 26 with an ink containing such an organic material using the ink-jet method, the ink is cured by UV irradiation. The sealing layer 6 covers the light-emitting element layer 5 and inhibits foreign matter, such as water and oxygen, from infiltrating to the light-emitting element layer 5.

The protection member 9 is bonded to the sealing layer 6 with the adhesive layer 8 interposed therebetween and functions as a support member when the mother substrate 50 is peeled off. Examples of a material of the protection member 9 include polyethylene terephthalate (PET).

After the mother substrate 50 has been peeled off, the support member 10 is bonded to the lower face of the resin layer 12 so as to manufacture an EL device having excellent flexibility. Examples of a material of the support member 10 include polyethylene terephthalate (PET).

The function film has an optical compensation function, a touch sensor function, a protective function, and the like, for example. The electronic circuit board is an IC chip or a flexible printed circuit board that is mounted on a plurality of terminals TM, for example.

First Embodiment

Hereinafter, the step 7 (irradiation with a laser) and step 8 (peeling of a mother substrate) that are features of the disclosure will be described. These steps 7 and 8 relate to so-called Laser Lift Off (LLO).

Outline of LLO

Figure 3A:
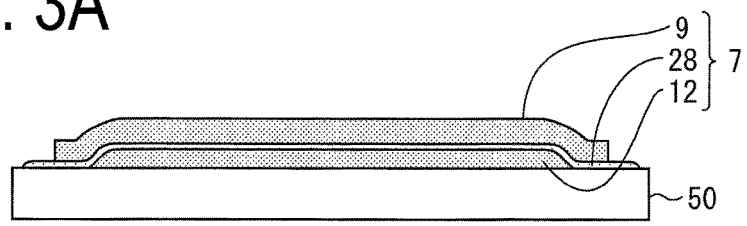
FIGS. 3A to 3C are each a cross-sectional view illustrating a configuration example of an EL device of the present embodiment during a step of manufacturing the EL device.
Figure 3B:
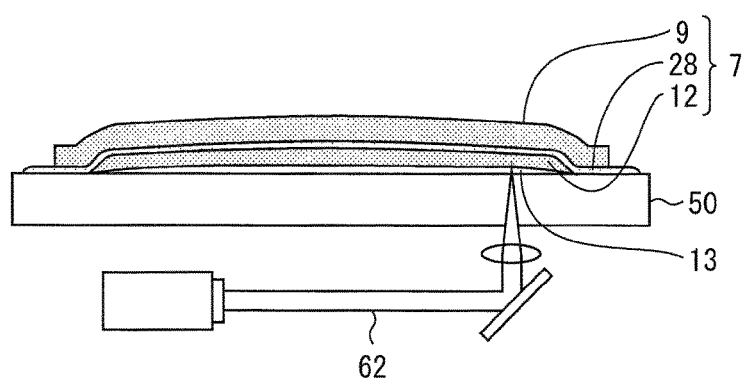
Figure 3C:
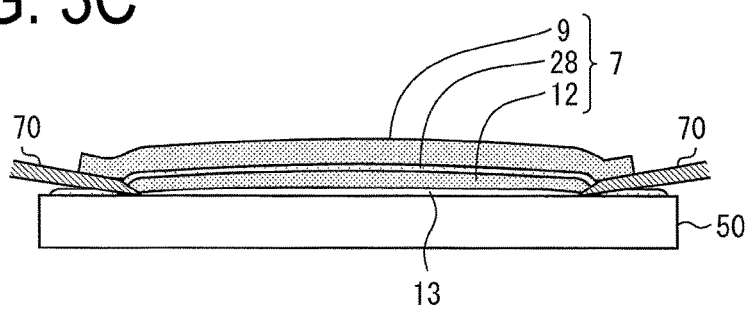

FIGS. 3A to 3C are each a cross-sectional view illustrating a configuration example of the EL device of the present embodiment during a step of manufacturing the EL device. FIG. 3A illustrates a state before step 7, FIG. 3B illustrates a state in step 7, and FIG. 3C illustrates a state in step 8. FIGS. 3A to 3C each illustrate the configuration example in which the EL layer is formed on the mother substrate 50. In FIGS. 3A to 3C, the EL layer and the like are not described in detail, and only the mother substrate 50, the resin layer 12, the second inorganic sealing film 28, and the protection member 9 in FIG. 2A are illustrated.

As illustrated in FIG. 3A, the resin layer 12 is formed on the mother substrate 50, and the protection member 9 is formed on an outermost surface of the EL layer and the like formed on the resin layer 12 with the EL layer and the like (not illustrated) interposed between the protection member 9 and the mother substrate 50, in the configuration example before step 7.

As described with reference to FIG. 1, step 7 is a step for irradiating the resin layer 12 with a laser as a preceding stage for peeling the resin layer 12 from the mother substrate 50. As illustrated in FIG. 3B, step 7 is performed by radiating a laser 62 from a position below the mother substrate 50 toward the protection member 9 in the present embodiment. In step 7, the resin layer 12 made of polyimide or the like is not completely peeled from the mother substrate 50 composed of a glass substrate or the like in many cases.

Thus, as illustrated in FIG. 3C, a layered body 7 is peeled from the mother substrate 50 using a knife 70 after a laser is radiated, as an additional process (step 8). In the example illustrated in FIG. 3C, a process is illustrated of inserting the knife 70 into an interface between the mother substrate 50 and the resin layer 12 in a lateral direction (a direction nearly parallel to a surface of the mother substrate 50).

In this process, it is difficult to insert the knife 70 accurately into the interface between the resin layer 12 and the mother substrate 50 due to the reason that the knife 70 is likely to slide on an upper face of the resin layer 12, for example, so that it may be difficult to peel the resin layer 12 from the mother substrate 50 with a high yield rate.

Irradiation Condition and Peel Property

Figure 4A:
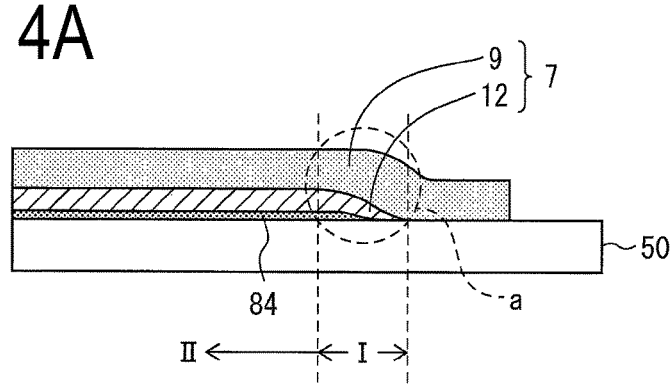
FIGS. 4A and 4B are drawings each illustrating an outline of an LLO process.

With reference to FIGS. 4A to 5B, the embodiment will be described in detail. FIGS. 4A, 4B, 5A, and 5B each illustrate an outline of an LLO process. FIGS. 4A and 5A each illustrate a state after step 7, and FIGS. 4B and 5B each illustrate a state in step 8.

Figure 5A:
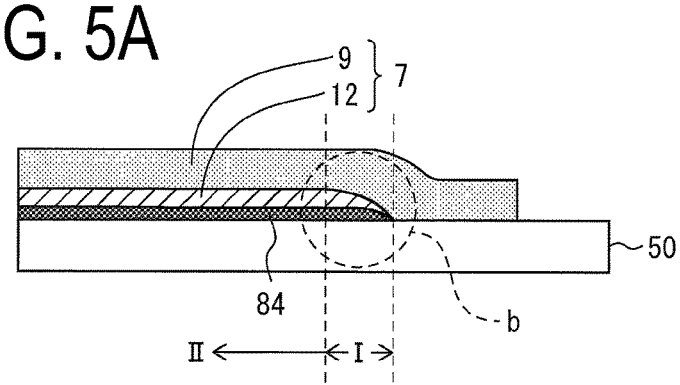
FIGS. 5A and 5B are drawings each illustrating an outline of an LLO process.

As illustrated in FIGS. 4A and 5A, irradiation with a laser in step 7 causes ash 84 to generate between the mother substrate 50 and the resin layer 12. The amount of the ash 84 generated increases with a condition where the layered body 7 is more strongly irradiated with a laser.

FIG. 4A illustrates a case where a laser is radiated under condition where an energy density is 200 mJ/cm$^2$, and an overlap is 50%, and FIG. 5A illustrates a case where a laser is radiated under condition where an energy density is 240 mJ/cm$^2$, and an overlap is 50%. The amount of the ash 84 generated in an example illustrated in FIG. 5A is greater than that in an example illustrated in FIG. 4A.

As the amount of the ash 84 generated between the mother substrate 50 and the resin layer 12 increases, peeling of the resin layer 12 from the mother substrate 50 becomes easier. However, a large amount of ash generated may contaminate the inside of a device or a clean room during peeling or during transportation to cause deterioration in yield. When a peeling step is performed with irradiation with high energy, a resin layer and an OLED layer in an upper layer of the resin layer may be indirectly damaged, and display characteristics and the like may deteriorate.

Figure 4B:
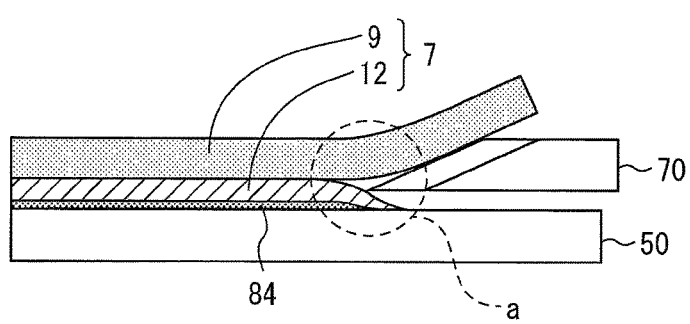

For details, a small amount of the ash 84 causes insufficient separation between the mother substrate 50 and the resin layer 12 as illustrated in FIG. 4B. That is, as illustrated in a portion "a" surrounded with a dotted line in FIG. 4A, an end portion of the resin layer 12 still bonded to the mother substrate 50 is likely to remain thereon. This causes the knife 70 to slide easily on the resin layer 12 in step 8, so that peeling of the resin layer 12 from the mother substrate 50 is likely to be defective.

Figure 5B:
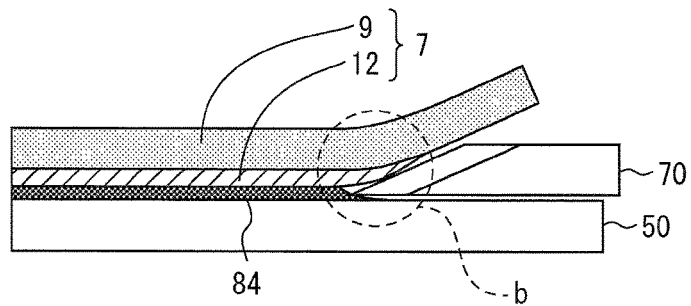

Meanwhile, a large amount of the ash 84 allows sufficient separation between the mother substrate 50 and the resin layer 12 as illustrated in FIG. 5B. That is, an end portion of the resin layer 12 still bonded to the mother substrate 50 as illustrated in the portion "a" surrounded with the dotted line in FIG. 4A is less likely to remain thereon. Rather, the ash 84 between the resin layer 12 and the mother substrate 50 is easily generated to an end portion of the resin layer 12 as illustrated in a portion "b" surrounded with a dotted line in FIG. 5A. This allows the knife 70 to be inserted easily under the resin layer 12, so that peeling of the resin layer 12 from the mother substrate 50 is less likely to be defective. Meanwhile, the ash 84 is black foreign matter and may be easily separated from the resin layer and scattered to contaminate the inside of a device or a clean room. Thus, generation of the ash 84 needs to be reduced, as much as possible. In addition, to reduce influence on display performance, it is preferable to reduce irradiation energy to a display region as much as possible.

Multiple Irradiation

In the present embodiment, steps 7 and 8 are performed on the basis of knowledge described above found by the inventors to satisfy both peel property and characteristics as a display material.

Figure 6A:
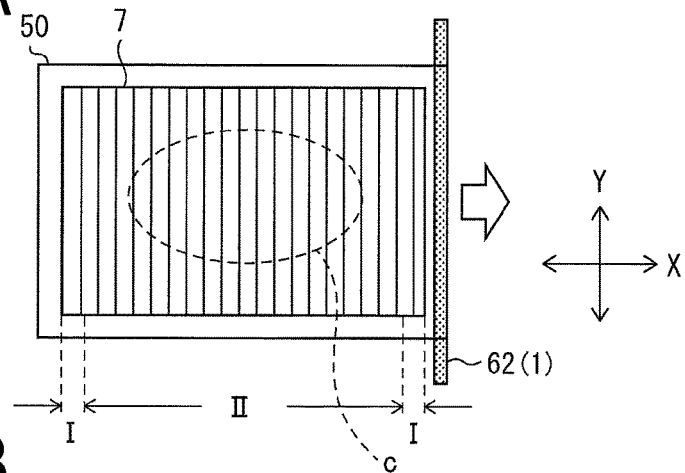
FIGS. 6A to 6C are drawings each illustrating an outline of steps 7 and 8 of the present embodiment.
Figure 6B:
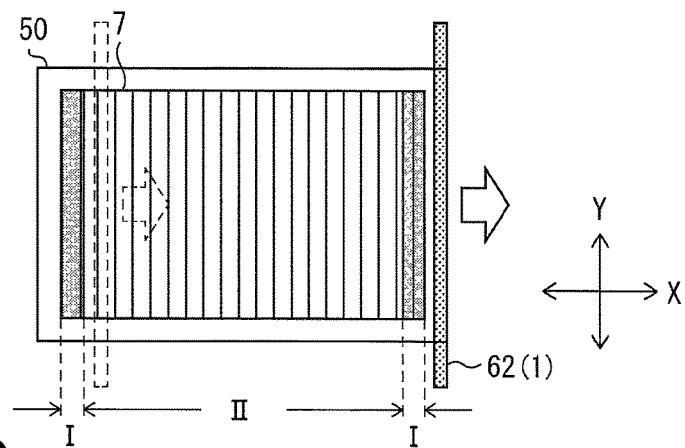
Figure 6C:
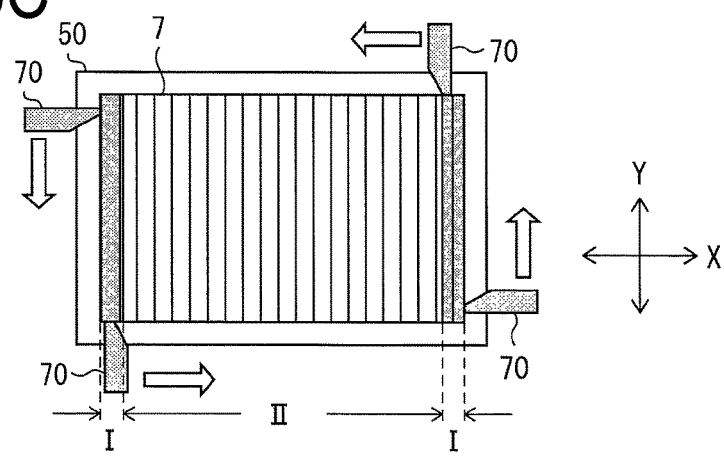

FIGS. 6A to 6C are each a cross-sectional view illustrating a configuration example of the EL device of the present embodiment during a step of manufacturing the EL device. FIGS. 6A and 6B each illustrate a state in step 7, and FIG. 6C illustrates a state in step 8.

In the present embodiment, the laser irradiation condition for the layered body 7 in step 7 is different between an inclined region I and a flat region II. The inclined region I is a region from a portion of the resin layer 12 starting to decrease in thickness to a portion without the resin layer 12 as described above with reference to FIGS. 3A to 3C, and corresponds to an end portion of the layered body 7. Meanwhile, the flat region II is a portion uniform in thickness of the resin layer 12 and includes a central portion (a portion "c" surrounded with a dotted line in FIG. 6A) of the layered body 7. The flat region II corresponds to a portion that is mainly used as a display material, and the inclined region I corresponds to an end portion that is mainly used for peeling of the layered body 7.

In the present embodiment, after a whole region of the layered body 7 (the inclined region I and the flat region II) is irradiated with a laser under an optimum condition for a substrate-central portion, the inclined region I of the layered body 7 is irradiated with a laser under a condition of generating ash. As a result, the inclined region I is irradiated more strongly with a laser than the flat region II.

Irradiation conditions of a laser may include an optimum condition for a substrate-central portion where an energy density is 200 mJ/cm$^2$, and an overlap is 50% (refer to FIGS. 4A and 4B), and a condition of generating ash where an energy density is 240 mJ/cm$^2$, and an overlap is 50% (refer to FIGS. 5A and 5B), for example.

Specifically, the layered body 7 is scanned with a line beam 62(1) twice to perform laser irradiation twice. Furthermore, the first laser irradiation and the second laser irradiation are different in irradiation condition and irradiation range.

FIG. 6A illustrates an outline of the first laser irradiation. While the mother substrate 50 is scanned with the line beam 62(1) in its longitudinal direction (indicated by the hollow arrow), the whole region of the layered body 7 is irradiated with a laser. An irradiation condition (an irradiation condition 1: irradiation condition of the first laser irradiation) for the scanning is set to the optimum condition for a substrate-central portion, and the irradiation condition is constant during the scanning. Under the irradiation condition, while ash is generated between the layered body 7 and the mother substrate 50, the amount of the ash does not impair use of the layered body 7 as a display material. Fine vertical lines (lines in Y-direction) each illustrated in the layered body 7 of FIG. 6A illustrate an image for each irradiation with a laser while the mother substrate 50 is scanned with the line beam 62(1). The same applies to other similar drawings (FIGS. 6B, 6C, 7A, 7B, 8A, 8B, and 9).

In addition, a condition of a laser for irradiating the inclined region I needs to be set only such that total irradiation energy in the inclined region I is greater than that in the flat region II. That is, when the inclined region I is also irradiated with a laser at the first irradiation for irradiating the flat region II, even in a case that energy at the second irradiation for the inclined region I is less than energy at the first irradiation, the inclined region I is more strongly irradiated with the laser than the flat region II, as a whole.

Subsequently, the second laser irradiation is similarly performed using the line beam 62(1). FIG. 6B illustrates an outline of the second laser irradiation. The second laser irradiation is different from the first laser irradiation in irradiation condition of a laser. Specifically, the layered body 7 is more strongly irradiated with a laser under the second laser irradiation condition (irradiation condition 2: irradiation condition of the second laser irradiation) than under the irradiation condition 1. For example, the irradiation condition 2 may serve as the condition of generating ash. The condition of generating ash is set such that overlap is equivalent to that under the condition for a substrate-central portion; however, energy is greater than that under the condition for a substrate-central portion, and the layered body 7 is strongly irradiated with a laser under the condition. A method for irradiating the layered body 7 more strongly under the irradiation condition 2 than under the irradiation condition 1 is not limited to this, and the layered body 7 can be strongly irradiated with a laser under irradiation condition where overlap is increased, for example.

The second laser irradiation is also different from the first laser irradiation in irradiation range. While a whole area of the layered body 7 is irradiated with a laser in the first laser irradiation, only the inclined region I of the layered body 7 is irradiated with a laser in the second laser irradiation. Specifically, while the mother substrate 50 is scanned with the line beam 62(1) in the longitudinal direction X (indicated by the hollow arrow) as in the first laser irradiation, a laser is radiated only when the line beam 62(1) passes through the inclined region I. The scanning direction is not limited to +X direction, and may be −X direction opposite to the direction indicated by the hollow arrow.

As described above, the whole of the layered body 7 (the inclined region I and the flat region II) is irradiated with a laser under a condition of generating less ash, and then only an end portion (the inclined region I) is irradiated with a laser under a condition of allowing the resin layer 12 to be easily peeled from the mother substrate 50 while generating more ash, in the present embodiment.

Subsequently, step 8 is performed using the knife 70 as illustrated in FIG. 6C. In step 7, a large amount of the ash 84 is generated between the resin layer 12 and the mother substrate 50 in the inclined region I, and this allows the resin layer 12 to be easily peeled from the mother substrate 50. Then, knives 70 are inserted into the respective four corners (included in the inclined region I) of the layered body 7, and are slid along corresponding sides different from each other as indicated by the respective hollow arrows in FIG. 6C, for example. This enables the resin layer 12 to be easily peeled from the mother substrate 50. In addition, the layered body 7 can be peeled from the mother substrate 50 while the protection member 9 that is easily peeled due to its slight adhesiveness is bonded to the sealing layer 6.

Further, a large amount of ash is not generated in the flat region II, so that the layered body 7 peeled can be favorably used as a display material.

Second Embodiment

Figure 7A:
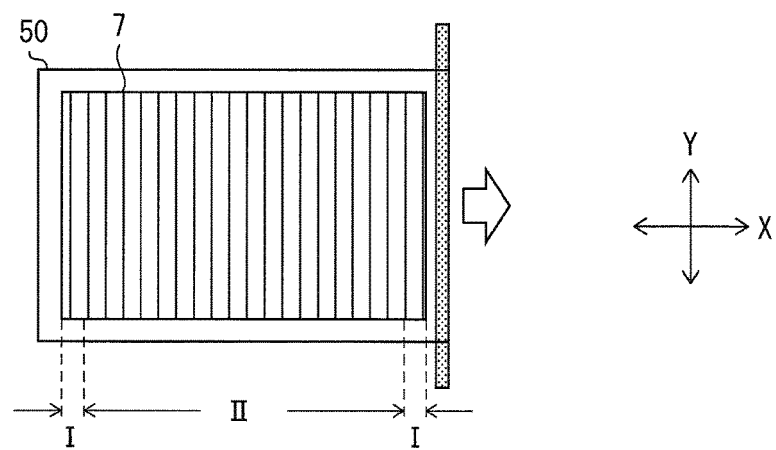
FIGS. 7A and 7B are drawings each illustrating an outline of step 7 of another embodiment.
Figure 7B:
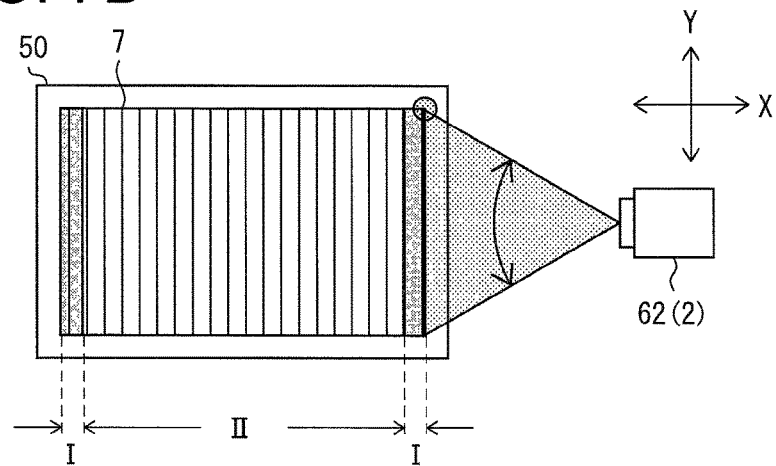

Hereinafter, another embodiment of the disclosure will be described with reference to FIGS. 7A and 7B. FIGS. 7A and 7B illustrate an outline of step 7 of the present embodiment. FIG. 7A illustrates an outline of the first laser irradiation in step 7, and FIG. 7B illustrates an outline of the second laser irradiation in step 7.

The first embodiment and the second embodiment are different in that the laser 62 to be used for the second laser irradiation is different. In the first embodiment, the line beam 62(1) is used for both the first laser irradiation and the second laser irradiation. In contrast, in the second embodiment, while the line beam 62(1) is used in the first laser irradiation, a Gaussian beam 62(2) using a galvanometer optical system is used in the second laser irradiation.

As illustrated in FIG. 7A, the first laser irradiation is performed such that the mother substrate 50 is scanned with the line beam 62(1) in the longitudinal direction X (indicated by the hollow arrow), and the entire layered body 7 is irradiated with a laser. The irradiation condition 1 is set as an irradiation condition of a laser.

Subsequently, each of the inclined regions I positioned on the both ends of the layered body 7 in longitudinal direction X is irradiated with a Gaussian beam, as illustrated in FIG. 7B. At this time, each of the inclined regions I is scanned with a Gaussian beam (indicated by the arc arrow) using the galvanometer optical system (Galvano scanner).

The irradiation condition 2 that causes more intense irradiation than the irradiation condition 1 is set as an irradiation condition, for example.

The irradiation condition of the second laser irradiation requires less precision than that in the irradiation condition of the first laser irradiation. Since the laser has been radiated once in the first laser irradiation, the irradiation condition of the second laser irradiation is a laser irradiation condition for more facilitating peeling of the layered body 7 from the mother substrate 50.

This allows the scanning in the second laser irradiation to be performed with a Gaussian beam of a Galvano scanner instead of the line beam 62(1) and can provide a manufacturing apparatus configured at low cost and improved processing capacity.

This is because when the Galvano scanner is used, the entire layered body 7 does not need to be scanned unlike the scanning with the line beam 62(1), and the layered body 7 is scanned within a limited and desired range and is irradiated with a laser.

Third Embodiment

Hereinafter, yet another embodiment of the disclosure will be described with reference to FIGS. 8A and 8B.

FIGS. 8A and 8B illustrate an outline of step 8 of the present embodiment. FIG. 8A illustrates insertion of a knife 70, and FIG. 8B illustrates an outline of peeling of a layered body 7.

The first embodiment and the third embodiment are different in the number of sides for performing a peeling process using the knife 70 in step 8. In the first embodiment, the peeling process using the knife 70 is performed on all four sides of the mother substrate 50. In contrast, in the third embodiment, the layered body 7 is peeled from the mother substrate 50 using the knife 70 such that the knife 70 is inserted only in one side of the mother substrate 50 in its longitudinal direction X (one short side of the layered body 7) (refer to FIG. 8A). As illustrated in FIG. 8A, this peeling is performed by inserting the knife 70 into an end portion of one short side of the layered body 7 on which laser irradiation under the irradiation condition 2 is performed and sliding the knife 70 in Y direction (indicated by the hollow arrow).

Then, the layered body 7 is peeled from the mother substrate 50 while a portion peeled in FIG. 8A serves as a starting point (indicated by the hollow arrow) as illustrated in FIG. 8B. This is because once the knife 70 can be inserted into a portion between the layered body 7 and the mother substrate 50, the portion can trigger the peeling of the entire layered body 7 from the mother substrate 50.

The present embodiment enables not only workload using the knife 70 to be reduced to about a quarter of that in the above described embodiment, but also processing capacity to be improved.

The present embodiment also enables laser irradiation of the layered body 7 under the irradiation condition 2 to be performed only for one side to be peeled with the knife 70.

Fourth Embodiment

Hereinafter, yet another embodiment of the disclosure will be described with reference to FIG. 9. FIG. 9 illustrates an outline of step 7 of the present embodiment.

The first embodiment and the fourth embodiment are different in a portion irradiated with a laser under the irradiation condition 2 in step 7. In the first embodiment, the inclined regions I at the both ends of the layered body 7 in the longitudinal direction X of the mother substrate 50 are each irradiated with a laser under the irradiation condition 2. In contrast, in the fourth embodiment, four edge sides of the layered body 7 are each irradiated with a laser under the irradiation condition 2. That is, not only the inclined regions I at the both ends in the longitudinal direction X of the mother substrate 50, but also inclined regions I at the both ends in the short-hand direction Y thereof, are each irradiated with a laser under the irradiation condition 2.

This enables the layered body 7 to be peeled from the mother substrate 50 without using a knife 70.

Note that an irradiation condition of a laser is adjusted so that the layered body 7 is more strongly irradiated under the irradiation condition 2, and this allows the number of sides each to be irradiated with a laser under the irradiation condition 2 to be changed. For example, when only one side is irradiated with a laser under the irradiation condition 2 as in the third embodiment, the layered body 7 can be also peeled from the mother substrate 50 without using the knife 70.

Laser Intensity

In each of the embodiments, an irradiation condition of a laser is defined using energy (mJ/cm$^2$) and overlap (%). However, the irradiation condition (intensity) of a laser may be also defined using parameters other than the above. For example, the irradiation condition of a laser may be defined using a beam profile such as a beam shape (e.g., a line or a spot), a wavelength, the number of irradiation times, or the like.

For example, a wavelength of a laser can be defined as an irradiation condition of the laser while depth of the laser for the resin layer 12 made of polyimide or the like, and transmittance, for the laser, of the mother substrate 50 made of glass or the like, are optimized. Specifically, an excimer laser with a wavelength of 308 nm, a solid-state laser with a wavelength of 343 nm or 355 nm, and a spot laser with a wavelength of 355 nm or a line laser with a wavelength of 343 nm associated with a laser shape, for example, are appropriately used.

In addition, changing a condition during one scanning enables irradiation intensity of a laser to be different in a plane of the layered body 7.

Irradiation Range

A range of irradiation with a laser under the irradiation condition 2 does not necessarily coincide with that in the inclined region I. For example, the range may also be set at a portion where the resin layer 12 suddenly changes in thickness or shape in and near its end portion. This is because the portion requires much energy to peel the resin layer 12 from the mother substrate 50 in many cases.

In addition, a range of irradiation with a laser under the irradiation condition 2 may be also limited to a portion into which the knife 70 is inserted first. That is, the range may be also set at a point instead of a side. In this case, a laser of a galvanometer optical system is suitably used.

Further, a range of irradiation with a laser under the irradiation condition 2 may be also determined using a sensor. For example, a range of irradiation with a laser may be also appropriately determined by detecting an end face of the resin layer 12 or the layered body 7, or a change in thickness, with a sensor.

Supplement

A method for manufacturing an EL device according to a first aspect of the disclosure includes a process of peeling a mother substrate from a layered body including a light-emitting element layer with irradiation with a laser. The mother substrate and the layered body are in contact with each other with a resin layer of the layered body interposed between the mother substrate and the layered body, and in a case that the process of peeling is performed by irradiating the resin layer with the laser, an irradiation of the laser is performed on at least a part of an end portion of the resin layer under a condition different from a condition in a central portion of the resin layer.

According to the method for manufacturing an EL device of a second aspect of the disclosure, the irradiation of the laser is performed on at least the part of the end portion under a condition causing intense irradiation greater than irradiation of the central portion.

According to the method for manufacturing an EL device of a third aspect of the disclosure, the irradiation of the laser is performed on at least the part of the end portion more times than on the central portion.

According to the method for manufacturing an EL device of a fourth aspect of the disclosure, the irradiation of the laser is performed using a line beam.

According to the method for manufacturing an EL device of a fifth aspect of the disclosure, the irradiation of the laser is performed a plurality of times using a line beam, the irradiation of the laser is performed on a whole area of the resin layer at least one time of the plurality of times, and the irradiation of the laser is performed on only the end portion at least one time of the plurality of times.

According to the method for manufacturing an EL device of a sixth aspect of the disclosure, the irradiation of the laser is performed using a line beam and a Gaussian beam, the irradiation of the laser is performed on the whole area of the resin layer using the line beam, and the irradiation of the laser is performed on only the end portion using the Gaussian beam.

According to the method for manufacturing an EL device of a seventh aspect of the disclosure, the end portion includes at least one of edge sides of the resin layer.

According to the method for manufacturing an EL device of an eighth aspect of the disclosure, the end portion includes a portion decreasing in thickness of the resin layer.

According to the method for manufacturing an EL device of a ninth aspect of the disclosure, a peeling between the mother substrate and the layered body is performed by inserting a knife into the end portion after the irradiation of the laser.

According to the method for manufacturing an EL device of a tenth aspect of the disclosure, after an insertion of the knife, the knife is slid along the end portion subjected to the insertion of the knife.

According to the method for manufacturing an EL device of an eleventh aspect of the disclosure, a peeling between the mother substrate and the layered body is performed by inserting a knife into the end portion after the irradiation of the laser for one edge side of the resin layer, and after an insertion of the knife, the knife is slid along the end portion subjected to the insertion of the knife.

According to the method for manufacturing an EL device of a twelfth aspect of the disclosure, the peeling between the mother substrate and the layered body is performed with the end portion with the knife inserted serving as a starting point.

According to the method for manufacturing an EL device of a thirteenth aspect of the disclosure, the laser has greater energy under a condition for performing the irradiation of the laser on at least the part of the end portion than under a condition for performing the irradiation of the laser on the central portion.

According to the method for manufacturing an EL device of a fourteenth aspect of the disclosure, the laser is overlapped greatly under a condition for performing the irradiation of the laser on at least the part of the end portion than under a condition for performing the irradiation of the laser on the central portion.

According to the method for manufacturing an EL device of a fifteenth aspect of the disclosure, an amount of ash between the mother substrate and the layered body is generated after the irradiation of the laser greater at the end portion than at the central portion.

According to the method for manufacturing an EL device of a sixteenth aspect of the disclosure, the resin layer is peeled from the mother substrate in the end portion after the irradiation of the laser.

Additional Items

The disclosure is not limited to the embodiments described above. Embodiments obtained by appropriately combining technical approaches disclosed in the corresponding embodiments are also included within the technical scope of the disclosure. In addition, novel technical features may be formed by combining the technical approaches disclosed in the corresponding embodiments.

REFERENCE SIGNS LIST

2 EL device
4 TFT layer
3 Inorganic barrier film
5 Light-emitting element layer
6 Sealing layer
7 Layered body
8, 11 Adhesive layer
9 Protection member
10 Support member
12 Resin layer
13 Peeling layer
15 Semiconductor film
16 Gate insulating film
16, 18, 20 Inorganic insulating film
21 Flattening film
22 Anode electrode
23$b$ Bank
23$c$ Partition
24 EL layer
25 Cathode electrode
26 First inorganic sealing film
26, 28 Inorganic sealing film
27 Organic sealing film
28 Second inorganic sealing film
⇋Function film
50 Mother substrate
62 Laser
62(1) Line beam
62(2) Gaussian beam
70 Knife
84 Ash
X Longitudinal direction of mother substrate
Y Short-hand direction of mother substrate I Inclined region (end portion)
II Flat region (central portion)
DA Active region
NA Non-active region

The invention claimed is:

1. A method for manufacturing an electroluminescence (EL) device comprising:
a process of peeling a mother substrate and a layered body including a light-emitting element layer from each other by irradiation with a laser, wherein
the mother substrate and the layered body are in contact with each other with a resin layer of the layered body interposed between the mother substrate and the layered body, and
in a case that the process of peeling is performed by irradiating the resin layer with the laser, an irradiation of the laser is performed on at least a portion of an end portion of the resin layer under a condition different from a condition in a central portion of the resin layer,
the process of peeling the mother substrate and the layered body is performed by inserting a knife into the end portion after the irradiation by the laser,
after an insertion of the knife, the knife is slid along the end portion subjected to the insertion of the knife, and
the layered body includes the resin layer and an inorganic film, and the process of peeling the mother substrate and the layered body from each other is started by inserting the knife between the mother substrate and the inorganic film.

2. The method for manufacturing an EL device according to claim 1, wherein the irradiation of the laser is performed on the at least the portion of the end portion under a condition causing intense irradiation greater than irradiation of the central portion.

3. The method for manufacturing an EL device according to claim 1, wherein the irradiation of the laser is performed on the at least the portion of the end portion more times than on the central portion.

4. The method for manufacturing an EL device according to claim 1, wherein the irradiation of the laser is performed using a line beam.

5. The method for manufacturing an EL device according to claim 1, wherein
the irradiation of the laser is performed a plurality of times using a line beam,
the irradiation of the laser is performed on a whole area of the resin layer at least one time of the plurality of times, and
the irradiation of the laser is performed on only the end portion at least one time of the plurality of times.

6. The method for manufacturing an EL device according to claim 1, wherein the end portion includes at least one of edge sides of the resin layer.

7. The method for manufacturing an EL device according to claim 1, wherein the end portion includes a portion decreasing in thickness of the resin layer.

8. The method for manufacturing an EL device according to claim 1, wherein the laser has greater energy under a condition of performing the irradiation of the laser on the at least the portion of the end portion than under a condition for performing the irradiation of the laser on the central portion.

9. The method for manufacturing an EL device according to claim 1, wherein the laser is overlapped more under a condition of performing the irradiation of the laser on the at least the portion of the end portion than under a condition for performing the irradiation of the laser on the central portion.

10. The method for manufacturing an EL device according to claim 1, wherein an amount of ash generated between the mother substrate and the layered body after the irradiation of the laser is greater at the end portion than at the central portion.

11. The method for manufacturing an EL device according to claim 1, wherein the resin layer is peeled from the mother substrate in the end portion after the irradiation of the laser.

12. The method for manufacturing an EL device according to claim 1, wherein
the layered body includes the resin layer and an inorganic film, and
the inorganic film covers the end portion of the resin layer.

13. A method for manufacturing an electroluminescence (EL) device comprising:
a process of peeling a mother substrate and a layered body including a light-emitting element layer from each other by irradiation with a laser, wherein
the mother substrate and the layered body are in contact with each other with a resin layer of the layered body between the mother substrate and the layered body,
in a case that the peeling is performed by irradiating the resin layer with the laser, the irradiation is performed on at least a portion of an end portion of the resin layer under a condition different from a condition in a central portion of the resin layer,
the irradiation is performed using a line beam and a Gaussian beam,
the irradiation is performed on an entirety of the resin layer using the line beam, and
the irradiation is performed on only the end portion using the Gaussian beam.

14. The method for manufacturing an EL device according to claim 13, wherein the laser has greater energy under a condition of performing the irradiation of the laser on the at least the portion of the end portion than under a condition for performing the irradiation of the laser on the central portion.

15. The method for manufacturing an EL device according to claim 13, wherein the resin layer is peeled from the mother substrate in the end portion after the irradiation of the laser.

16. The method for manufacturing an EL device according to claim 13, wherein
the layered body includes the resin layer and an inorganic film, and
the inorganic film covers the end portion of the resin layer.

17. A method for manufacturing an electroluminescence (EL) device comprising:
a process of peeling a mother substrate and a layered body including a light-emitting element layer from each other by irradiation with a laser, wherein
the mother substrate and the layered body are in contact with each other with a resin layer of the layered body interposed between the mother substrate and the layered body, and
in a case that the process of peeling is performed by irradiating the resin layer with the laser, an irradiation of the laser is performed on at least a portion of an end portion of the resin layer under a condition different from a condition in a central portion of the resin layer,
the process of peeling the mother substrate and the layered body is performed by inserting a knife into the end portion after the irradiation by the laser of one edge side of the resin layer, after an insertion of the knife, the knife is slid along the end portion subjected to the insertion of the knife, the process of peeling the mother substrate and the layered body is performed at the end portion with the knife inserted serving as a starting point, and the layered body includes the resin layer and an inorganic film, and the process of peeling the mother substrate and the layered body from each other is started by inserting the knife between the mother substrate and the inorganic film.

18. The method for manufacturing an EL device according to claim 17, wherein the laser has greater energy under a condition of performing the irradiation of the laser on the at least the portion of the end portion than under a condition for performing the irradiation of the laser on the central portion.

19. The method for manufacturing an EL device according to claim 17, wherein the resin layer is peeled from the mother substrate in the end portion after the irradiation of the laser.

20. The method for manufacturing an EL device according to claim 17, wherein the layered body includes the resin layer and an inorganic film, and the inorganic film covers the end portion of the resin layer.

* * * * *